(12) United States Patent
Abe

(10) Patent No.: US 6,777,620 B1
(45) Date of Patent: Aug. 17, 2004

(54) CIRCUIT BOARD

(75) Inventor: Takashi Abe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/685,771

(22) Filed: Oct. 11, 2000

(30) Foreign Application Priority Data

Dec. 2, 1999  (JP) .......................................... 11/343955

(51) Int. Cl.[7] .............................. H05K 1/00; H05K 1/03
(52) U.S. Cl. ...................... 174/255; 174/261; 174/262; 174/264; 361/792; 361/794
(58) Field of Search .................. 174/250, 255, 174/256, 259, 260, 261, 262, 263, 264; 361/760, 792, 793, 794, 752, 753, 767, 796, 800, 808, 818, 820

(56) References Cited

U.S. PATENT DOCUMENTS

| | | | | |
|---|---|---|---|---|
| 4,249,302 A | * | 2/1981 | Crepeau ...................... 29/830 |
| 4,758,922 A | * | 7/1988 | Ishigaki et al. ............. 361/330 |
| 5,039,965 A | * | 8/1991 | Higgins, Jr. ................ 333/182 |
| 5,376,759 A | * | 12/1994 | Marx et al. ................. 174/255 |
| 5,714,718 A | * | 2/1998 | Tanaka ....................... 174/255 |
| 5,768,109 A | * | 6/1998 | Gulick et al. ............... 361/794 |
| 6,011,691 A | * | 1/2000 | Schreffler ................... 361/704 |
| 6,147,876 A | * | 11/2000 | Yamaguchi et al. ........ 361/766 |
| 6,353,540 B1 | * | 3/2002 | Akiba et al. ................ 174/255 |
| 6,449,168 B1 | * | 9/2002 | Soderholm .................. 361/761 |

FOREIGN PATENT DOCUMENTS

| | | | |
|---|---|---|---|
| JP | 4-261098 | | 9/1992 |
| JP | 407202477 A | * | 8/1995 |
| JP | 7-263871 | | 10/1995 |
| JP | 11-220263 | | 8/1999 |

\* cited by examiner

*Primary Examiner*—Evan Pert
*Assistant Examiner*—J B Patel
(74) *Attorney, Agent, or Firm*—Sughrue Mion, PLLC

(57) ABSTRACT

A substrate of the present invention includes pads which are provided on the surface of said substrate; and surface layers which are kept to the ground potential and cover the surface of said substrate except said pads and their peripheral. Another substrate of the present invention includes a part of circuit which is provided on the surface of said substrate; and a surface layers which are kept to the ground potential and cover the surface of said substrate except said part of circuit and its peripheral.

14 Claims, 3 Drawing Sheets

CIRCUIT BOARD

BACKGROUND OF THE INVENTION

1. Field of the Invention

The present invention relates to a circuit board, particularly relates to a circuit board wherein electronic parts and electrical components are mounted on the surface of a substrate such as a semiconductor chip.

2. Description of the Related Art

Currently, a circuit board is used for various electric equipment and information equipment. In a conventional circuit board, electronic parts are mounted on the top surface or the bottom surface of a substrate. As recent electric equipment and information equipment are miniaturized and are provided with high functions, technique for further integrating mounted electronic parts, forming a pattern of a few layers inside a circuit board and forming a circuit wherein these patterns are mutually connected has been also enhanced.

Such technique has been remarkably developed for a circuit board particularly used for a computer, however, as a digital signal is conducted in a circuit board used for this technical field, an electromagnetic wave is emitted from the circuit board as EMI noise. As EMI noise has an effect upon another circuit provided to the same electric equipment and information equipment or another electric equipment and information equipment, it is required to be reduced.

To prevent EMI noise from leaking outside the chassis of electric equipment and information equipment, a conductive sheet was arranged inside the chassis of electric equipment and the information equipment or the chassis was made of conductive material as a major conventional technique. Also, for another technique to reduce EMI noise in the electric equipment and the information equipment on which many circuit boards are mounted, a shield plate for shielding an electromagnetic wave was provided between circuit boards, or the surface of a circuit board is shielded in a state that electronic parts are mounted.

However, it has been difficult to reduce EMI emitted noise as the performance of electric equipment and information equipment is enhanced. Emitted EMI noise cannot be reduced by only applying the shield to the chassis of electric equipment and information equipment. Therefore, a method of directly reducing emitted EMI noise caused from a circuit board is required.

SUMMARY OF THE INVENTION

The object of the invention is to provide a circuit board wherein EMI noise emitted from the circuit board is reduced.

Another object of the invention is to provide a circuit board that can reduce noise mixed from an external device.

According to one aspect of the present invention, a substrate is provided which includes: pads which are provided on the surface of said substrate; and surface layers which are kept to the ground potential and cover the surface of said substrate except said pads and their peripheral.

According to another aspect of the present invention, a substrate is provided which includes: a part of circuit which is provided on the surface of said substrate; and a surface layers which are kept to the ground potential and cover the surface of said substrate except said part of circuit and its peripheral.

BRIEF DESCRIPTION OF THE DRAWINGS

Other features and advantages of the invention will be made more apparent by the following detailed description and the accompanying drawings, wherein.

In the drawings, the same reference numerals represent the same structural elements.

DETAILED DESCRIPTION OF THE PREFERRED EMBODIMENTS

A first embodiment of the present invention will be described in detail below.

Figure 1:
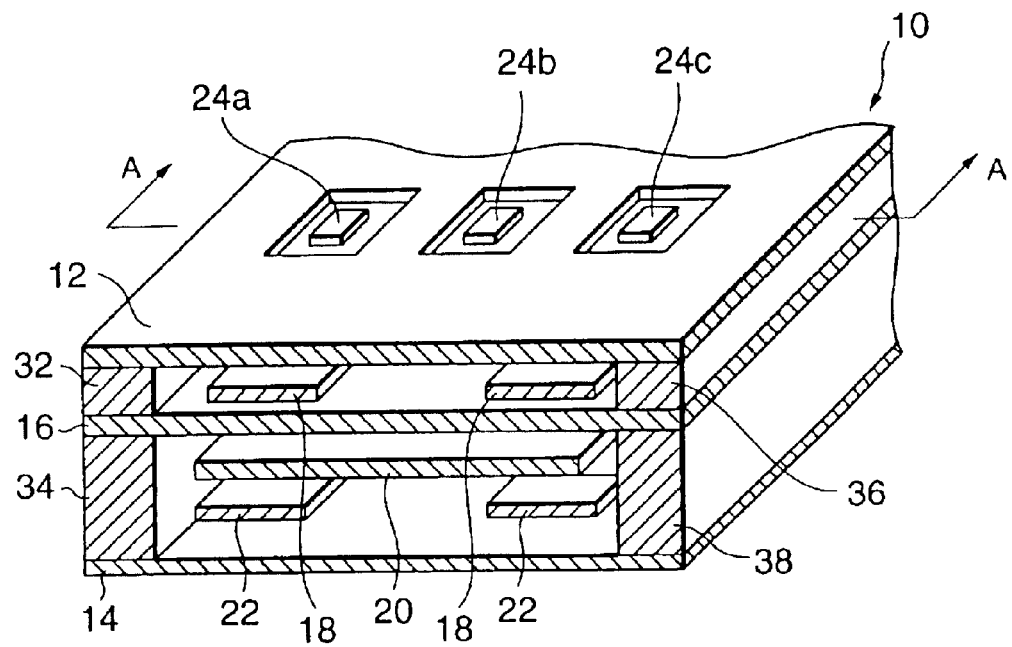
FIG. 1 is a perspective drawing showing a part of a circuit board equivalent to a first embodiment of the invention.

Referring to FIG. 1, a circuit board 10 includes ground layers 12, 14 and 16. The ground layer 12 is provided on the upper surface of the circuit board 10. The ground layer 14 is provided on the lower surface of the circuit board 10. The ground layers 12 and 14 form plural surface layers of the circuit board 10. The ground layer 16 is provided inside the circuit board 10. Specifically, the ground layer 16 is one of plural internal layers included in the circuit board 10. The ground layer 16 is put between the ground layers 12 and 14. The ground layers 12, 14 and 16 are electrically connected to a stable ground such as the body of chassis. For example, the ground layers 12, 14 and 16 are made of copper. The ground layers 12, 14 and 16 are formed so that they have the thickness of, for example, approximately 0.035 millimeter.

The circuit board 10 includes signal layers 18 and 22 and a power supply layer 20. The signal layer 18 is put between the ground layers 12 and 16. The signal layer 22 is put between the ground layers 14 and 16. The power supply layer 20 is put between the ground layers 14 and 16. Insulating material is filled between these layers. For example, glass epoxy resin is used for the insulating material. Pads 24a, 24b and 24c are provided on the upper surface of the circuit board 10. The pads 24a, 24b and 24c are used to electrically connect electronic parts mounted on the surface of the circuit board 10. The ground layer 12 is removed in parts in which the pads 24a, 24b and 24c are respectively provided. That is, the ground layer 12 is formed in the whole area except the pads 24a, 24b and 24c and their peripheral areas on the upper surface of the circuit board 10. It is desirable that an interval between each pad 24a, 24b, 24c and the ground layer 12 is as narrow as possible in a range where no short circuit is caused. The ground layer 14 is uniformly formed in the whole area of the lower surface of the circuit board 10.

In this embodiment, plural pads are provided on the upper surface of the circuit board 10, however, plural pads may be also provided on both the upper and lower surfaces of the circuit board 10. In this case, the ground layer 14 is formed in the whole area except the plural pads and their peripheral areas on the lower surface of the circuit board 10.

Pads are provided by making a hole in the ground layer formed on the surface of the circuit board to supply power and a signal to an electronic circuit mounted on the surface of the circuit board. The pads and the power supply layer or the signal layer are electrically connected via wiring.

Figure 2:
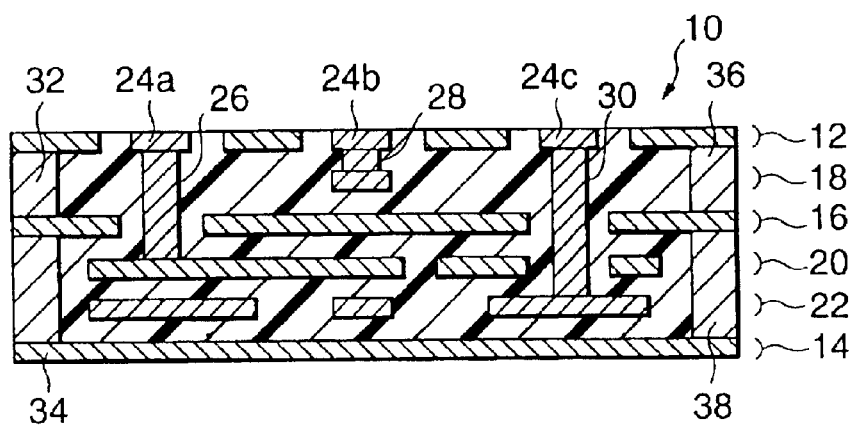
FIG. 2 is a sectional view viewed along a line A—A of the circuit board according to the invention shown in FIG. 1.

Referring to FIG. 2, via holes 26, 28 and 30 are formed inside the circuit board 10. The pad 24a is connected to the power supply layer 20 via the via hole 26 and power is supplied to an electronic part mounted on the upper surface of the circuit board 10. The pads 24b and 24c are connected to the signal layers 18 and 22 via the via holes 28 and 30, respectively. The pads 24b and 24c receive and transmit various electric information from/to an electronic part mounted on the upper surface of the circuit board 10.

Conductive elements 32 and 36 are provided between the round layers 12 and 16. Conductive elements 34 and 38 are provided between the ground layers 14 and 16. The conductive elements 32, 36, 34 and 38 are conductive and electrically connect the ground layers 12 and 14. Concretely, the conductive element 32 electrically connects the ground layers 12 and 16. The conductive element 34 electrically connects the ground layers 16 and 14. The conductive element 36 electrically connects the ground layers 12 and 16. The conductive element 38 electrically connects the ground layers 16 and 14. The conductive elements 32, 36, 34 and 38 may be made of the same material as that of a signal conductor.

An electronic part mounted on the circuit board is provided with a ground pin that defines ground potential. The ground pin can be connected to any of the ground layers 12, 14 and 16, however, it is desirable that it is electrically connected to the ground layer 12 for convenience of wiring.

In the circuit board 10 in this embodiment, power is supplied from the power supply layer 20 provided inside the circuit board 10 to an electronic part mounted on the surface of the board and ground potential is defined by connecting the ground pin of the electronic part to the ground layer 12. Also, a signal is received or transmitted from/to an electronic circuit via signal conductors 18 and 22. Therefore, in the circuit board 10 in this embodiment, a digital signal is conducted in the signal conductors 18 and 22 arranged in the circuit board 10 and the circuit board 10 is formed so that the ground layers 12, 14 and 16 cover the signal conductors 18 and 22. Therefore, less EMI noise is emitted from the circuit board 10.

The circuit board according to the invention is not limited to that in the embodiment described above and may be freely varied in a range of the invention. For example, the number of ground layers, power supply layers and signal layers respectively provided between the ground layers 12 and 14 may be arbitrary. Also, respective wiring for supplying power, ground and a signal can be also provided in the same layer.

Also, in the embodiment described above, the surface layer of the circuit board 10 is kept to ground potential, covers an area except the pad and the periphery and is composed of two sides of the ground layers 12 and 14 or four sides of the ground layers 12 and 14 and both sides of the board 10, however, the surface layer may be also composed of six sides of the ground layers 12 and 14, both sides of the board 10 and the front and back of the board 10.

In this embodiment, the pads 24 are formed on the upper surface of the circuit board 10, however, a part of a circuit, for example, a pad, a pattern and a via hole, may be also formed on the upper surface of the circuit board 10 in stead of the pads. In this case, the pad and the via hole are connected via the pattern, and the pad and a signal conductor in an internal layer transmit a signal via the via hole and the pattern.

Next, a second embodiment of the present invention will be described in detail. The second embodiment is characterized in that a ground layer on the upper surface and a ground layer on the lower surface are electrically connected via a via hole. The other configuration is similar to that in the first embodiment.

Figure 3:
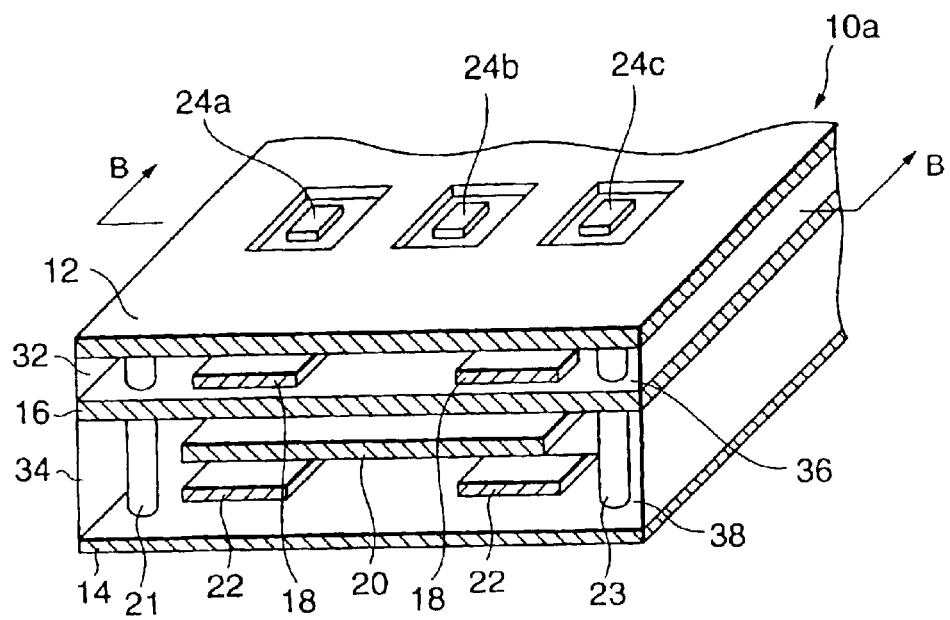
FIG. 3 is a perspective drawing showing a part of a circuit board equivalent to a second embodiment of the invention.
Figure 4:
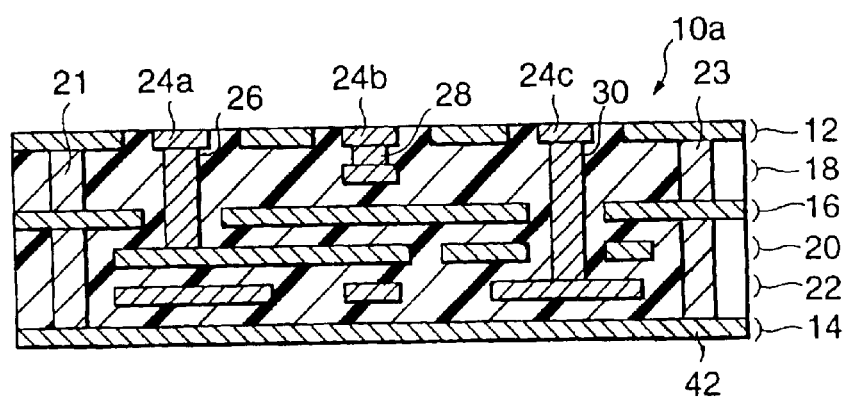
FIG. 4 is a sectional view viewed along a line B—B of the circuit board according to the invention shown in FIG. 3.

Referring to FIGS. 3 and 4, a circuit board 10a includes plural via holes 21 and 23. The via hole 21 electrically connects ground layers 12, 16 and 14. Conductive material is filled inside the via hole 21. The via hole 23 electrically connects the ground layers 12, 16 and 14. Conductive material is filled inside the via hole 23.

In this embodiment, the number of via holes is not particularly limited. Only one via hole may be provided to each side of the circuit board 10a. Plural via holes may otherwise be also provided to each side.

Next, a third embodiment of the present invention will be described in detail. The third embodiment is characterized in that a ground layer on the upper surface and a ground layer on the lower surface are electrically connected via a conductive layer formed on the side. The other configuration is similar to that in the first embodiment.

Figure 5:
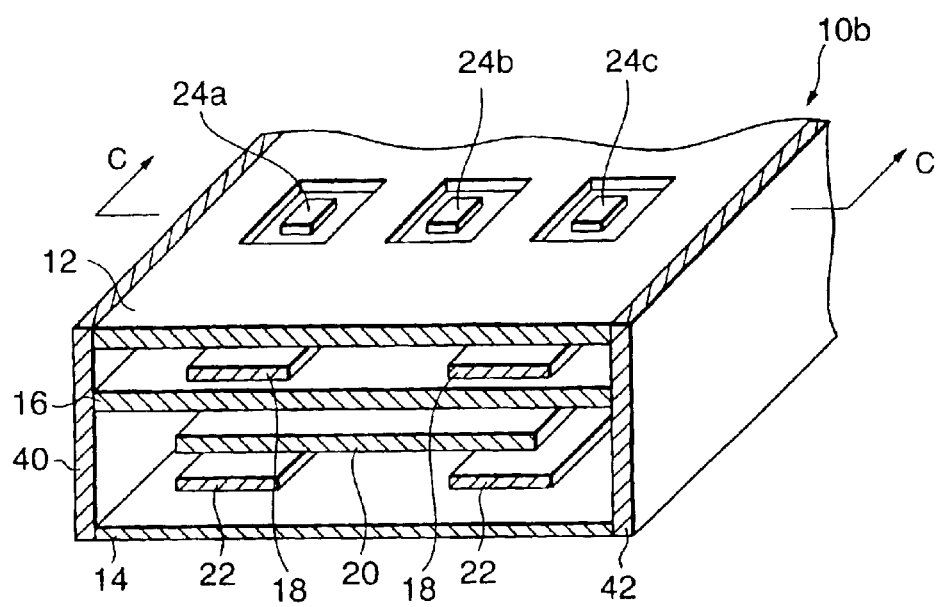
FIG. 5 is a perspective drawing showing a part of a circuit board equivalent to a third embodiment of the invention.
Figure 6:
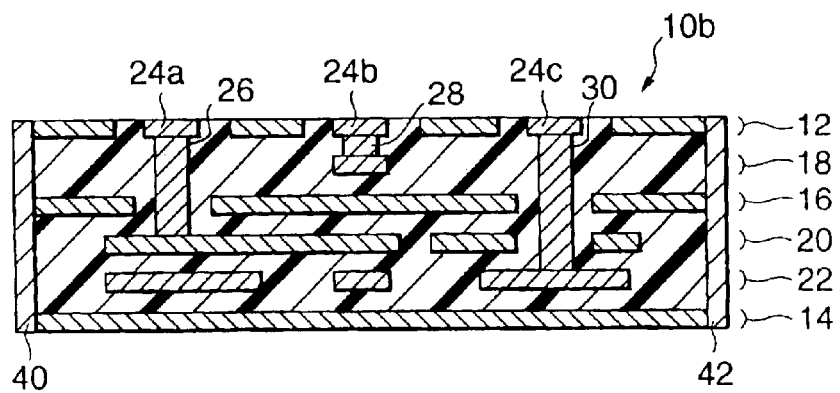
FIG. 6 is a sectional view viewed along a line C—C of the circuit bird according to the invention shown in FIG. 5.

Referring to FIGS. 5 and 6, a circuit board 10b is provided with conductive layers 40 and 42. The conductive layer 40 is provided to one side of the circuit board 10b and the conductive layer 42 is provided to the other side. Each of the conductive layers 40 and 42 electrically connect the ground layers 12 and 14. The conductive layers 40 and 42 may be made of the same material as that of the ground layers 12 and 14.

As described above, according to the invention, as the ground layers are formed on the top surface and the bottom surface of the circuit board, EMI noise can be reduced. Also, as the ground layers are formed on the top surface and the bottom surface of the circuit board, noise mixed from an external device, which deteriorates a signal conducted in the signal layer, can be reduced. Also, as wiring for transmitting a signal is not formed on the top surface and the bottom surface of the circuit board, there is also effect that a value of characteristic impedance is readily standardized.

While this invention has been described in conjunction with the preferred embodiments described above, it will now be possible for those skilled in the art to put this invention into practice in various other manners.

What is claimed is:

1. A substrate comprising:

pads which are provided on the surface of said substrate;

surface layers which are kept to the ground potential and cover the surface of said substrate except said pads and their narrow periphery, wherein said surface layers include a top main surface and a bottom main surface; and conductive elements which electronically connect said top main surface and said bottom main surface and cover an entire side of said substrate with said top main surface and said bottom main surface.

2. The substrate as claimed in claim 1, further comprising:

vias which electronically connects said top main surface and said bottom main surface.

3. The substrate as claimed in claim 2, wherein said vias are provided on the side portion of said substrate.

4. The substrate as claimed in claim 1, wherein said surface layers further includes a side layer which electronically connects said top main surface and said bottom main surface.

5. The substrate as claimed in claim 1, wherein said surface layers includes six surface layers.

6. The substrate as claimed in claim 1, further comprising a signal layer which is provided between said top main surface and said bottom main surface, and has a pattern which is connected to at least one of said pads.

7. The substrate as claimed in claim 1, wherein an interval between said pad and said surface layer is defined to prevent said pad form short-circuiting.

8. A substrate comprising:
 a part of circuit which is provided on the surface of said substrate;
 surface layers which are kept to the ground potential and cover the surface of said substrate except said part of circuit and its narrow periphery, wherein said surface layers include a top main surface and a bottom main surface; and
 conductive elements which electronically connect said top main surface and said bottom main surface and cover an entire side of said substrate with said top main surface and said bottom main surface.

9. The substrate as claimed in claim 8, further comprising:
 vias which electronically connects said top main surface and said bottom main surface.

10. The substrate as claimed in claim 9, wherein said vias are provided on the side portion of said substrate.

11. The substrate as claimed in claim 8, wherein said surface layers further include a side layer which electronically connects said top main surface and said bottom main surface.

12. The substrate as claimed in claim 8, wherein said surface layers include six surface layers.

13. The substrate as claimed in claim 8, further comprising a signal layer which is provided between said top main surface and said bottom main surface, and has a pattern which is connected to said part of circuit.

14. The substrate as claimed in claim 8, wherein an interval between said part of circuit and said surface layer is defined to prevent said part of circuit from short-circuiting.

* * * * *